United States Patent
Maharyta

(10) Patent No.: US 8,319,505 B1
(45) Date of Patent: Nov. 27, 2012

(54) METHODS AND CIRCUITS FOR MEASURING MUTUAL AND SELF CAPACITANCE

(75) Inventor: Andriy Maharyta, Lviv (UA)

(73) Assignee: Cypress Semiconductor Corporation, San Jose, CA (US)

( * ) Notice: Subject to any disclaimer, the term of this patent is extended or adjusted under 35 U.S.C. 154(b) by 240 days.

(21) Appl. No.: 12/606,147

(22) Filed: Oct. 26, 2009

Related U.S. Application Data

(63) Continuation-in-part of application No. 12/395,462, filed on Feb. 27, 2009.

(60) Provisional application No. 61/108,450, filed on Oct. 24, 2008.

(51) Int. Cl.
*G01R 27/26* (2006.01)

(52) U.S. Cl. .......... 324/658; 324/678

(58) Field of Classification Search .......... None
See application file for complete search history.

(56) References Cited

U.S. PATENT DOCUMENTS

| | | | |
|---|---|---|---|
| 6,720,777 B2 * | 4/2004 | Wang | 324/680 |
| 6,768,420 B2 | 7/2004 | McCarthy | |
| 7,006,938 B2 | 2/2006 | Laraia | |
| 7,075,864 B2 | 7/2006 | Kakitsuka | |
| 7,932,897 B2 | 4/2011 | Elias et al. | |
| 8,093,914 B2 | 1/2012 | Maharyta | |
| 8,169,238 B1 | 5/2012 | Maharyta et al. | |
| 2006/0273804 A1 * | 12/2006 | Delorme et al. | 324/658 |
| 2007/0173220 A1 | 7/2007 | Kim | |
| 2007/0236478 A1 | 10/2007 | Geaghan et al. | |
| 2012/0043140 A1 | 2/2012 | Peterson et al. | |
| 2012/0043971 A1 | 2/2012 | Maharyta | |
| 2012/0043973 A1 | 2/2012 | Kremin | |

FOREIGN PATENT DOCUMENTS

KR  1020100135220  12/2010

OTHER PUBLICATIONS

USPTO Non-Final Rejection for U.S. Appl. No. 11/442,212 dated Feb. 25, 2011; 13 pages.
USPTO Notice of Allowance for U.S. Appl. No. 12/332,980 dated Oct. 4, 2011; 5 pages.
USPTO Advisory Action for U.S. Appl. No. 12/332,980 dated Aug. 9, 2011; 3 pages.
USPTO Final Rejection for U.S. Appl. No. 12/332,980 dated May 31, 2011; 11 pages.
USPTO Non-Final Rejection for U.S. Appl. No. 12/332,980 dated Dec. 22, 2010; 9 pages.
USPTO Advisory Action for U.S. Appl. No. 12/395,462 dated Mar. 28, 2012; 2 pages.

(Continued)

*Primary Examiner* — Minh N Tang

(57) ABSTRACT

Capacitance measurement circuits for measuring self and mutual capacitances are described. In one embodiment the capacitance measurement circuit includes: a first electrode capacitively coupled with a second electrode; a first plurality of switches coupled with the first electrode; and a second plurality of switches coupled with the second electrode, wherein, during a first operation stage, the first plurality of switches is configured to apply a first initial voltage to the first electrode and the second plurality of switches is configured to apply a second initial voltage to the second electrode, and wherein, during a second operation stage, the first plurality of switches is configured to connect the first electrode with a measurement circuit, and the second plurality of switches is configured to connect the second electrode with a constant voltage.

23 Claims, 18 Drawing Sheets

OTHER PUBLICATIONS

USPTO Final Rejection for U.S. Appl. No. 12/395,462 dated Jan. 3, 2012; 6 pages.
USPTO Non-Final Rejection for U.S. Appl. No. 12/395,462 dated Aug. 23, 2011; 5 pages.
USPTO Requirement for Restriction for U.S. Appl. No. 12/395,462 dated May 13, 2011; 6 pages.
International Search Report of the International Searching Authority, dated Feb. 9, 2009 for International Application No. PCTUS2008/013622; 2 pages.
International Written Opinion of the International Searching Authority, dated Feb. 9, 2009 for International Application No. PCT/US2008/013622; 5 pages.
U.S. Appl. No. 61/016,123 "Capacitive Field Sensor With Sigma-Delta Modulator", filed Dec. 21, 2007, 23 pages.
U.S. Appl. No. 61/023,988 "Touch Sensing" Jon Peterson, et al., filed Jan. 28, 2008; 26 pages.
U.S. Appl. No. 61/024,158 "Multi-Touch Sensing Method With Differential Input" Dana Olson et al., filed Jan. 28, 2008; 19 pages.
U.S. Appl. No. 61/067,743 "Multi-Touch Sensing Method with Differential Input" Dana Olson et al., filed Feb. 29, 2008; 19 pages.
USPTO Final Rejection for U.S. Appl. No. 11/601,465 dated May 28, 2010; 12 pages.
USPTO Non-Final Rejection for U.S. Appl. No. 12/380,141 dated Sep. 19, 2011; 6 pages.
USPTO Notice of Allowance for U.S. Appl. No. 11/600,255 dated May 30, 2012.
USPTO Notice of Allowance for U.S. Appl. No. 12/040,387 dated Mar. 29, 2012; 8 pages.
USPTO Notice of Allowance for U.S. Appl. No. 12/239,692 dated Jan. 5, 2012; 8 pages.
USPTO Notice of Allowance for U.S. Appl. No. 12/239,692 dated May 16, 2012; 8 pages.
USPTO Notice of Allowance for U.S. Appl. No. 12/239,692 dated Jun. 25, 2012; 8 pages.
USPTO Notice of Allowance for U.S. Appl. No. 12/239,692 dated Oct. 13, 2011; 8 pages.
USPTO Notice of Allowance for U.S. Appl. No. 12/380,141 dated Jan. 26, 2012; 7 pages.
USPTO Notice of Allowance for U.S. Appl. No. 12/380,141 dated Apr. 10, 2012; 7 pages.
USPTO Notice of Allowance for U.S. Appl. No. 12/380,141 dated May 15, 2012; 7 pages.
U.S. Appl. No. 60/947,865: "Capacitive Field Sensor with Sigma-Delt Modulator," Viktor Kremin, filed Jul. 3, 2007; 33 pages.
U.S. Appl. No. 61/030,526: "Capacitive Sensing Universal System and Method," Andriy Ryshtun, filed Feb. 21, 2008; 22 pages.
Chapweske, Adam; "The PS/2 Mouse Interface," PS/2 Mouse Interfacing, 2001, retrieved on May 18, 2006; 11 pages.
Cypress Semiconductor Corporation, "CY8C21x34 Data Sheet," CSR User Module, CSR V.1.0; Oct. 6, 2005; 36 pages.
U.S. Appl. No. 61/108,450: "Alternative Realizations of the CSX (TxRx-I) Sensing Scheme for ITO Panels," Andriy Maharyta, filed Oct. 24, 2008; 7 pages.
USPTO Final Rejection for U.S. Appl. No. 12/395,969 dated Jul. 17, 2012; 25 pages.
USPTO Non-Final Rejection for U.S. Appl. No. 12/380,141 dated Sep. 5, 2012; 6 pages.
USPTO Notice of Allowance for U.S. Appl. No. 12/239,692 dated Aug. 15, 2012; 8 pages.
USPTO Notice of Allowance for U.S. Appl. No. 12/380,14 dated Jun. 14, 2012; 8 pages.
USPTO Notice of Allowance for 12/380,141 dated Jul. 31, 2012; 5 pages.
USPTO Notice of Allowance for U.S. Appl. No. 12/395,462 dated Jul. 20, 2012; 6 pages.
USPTO Notice of Allowance for U.S. Appl. No. 12/395,462 dated Aug. 29, 2012; 5 pages.

* cited by examiner

METHODS AND CIRCUITS FOR MEASURING MUTUAL AND SELF CAPACITANCE

CROSS REFERENCE TO RELATED APPLICATION

This application claims the benefit of U.S. Provisional Patent Application No. 61/108,450 filed Oct. 24, 2008. This application is a continuation-in-part of U.S. patent application Ser. No. 12/395,462 filed Feb. 27, 2009 which claims the benefit of U.S. Provisional Patent Application No. 61/067,539 filed Feb. 27, 2008.

TECHNICAL FIELD

The present disclosure relates generally to touch sensors and, more particularly, to capacitive touch sensors.

BACKGROUND

Capacitive touch sensors may be used to replace mechanical buttons, knobs and other similar mechanical user interface controls. The use of a capacitive sensor allows for the elimination of complicated mechanical switches and buttons, providing reliable operation under harsh conditions. In addition, capacitive sensors are widely used in modern customer applications, providing new user interface options in existing products.

BRIEF DESCRIPTION OF THE DRAWINGS

Embodiments are illustrated by way of example and are not intended to be limited by the figures of the accompanying drawings, in which like references indicate similar elements and in which.

DETAILED DESCRIPTION

Figure 1:
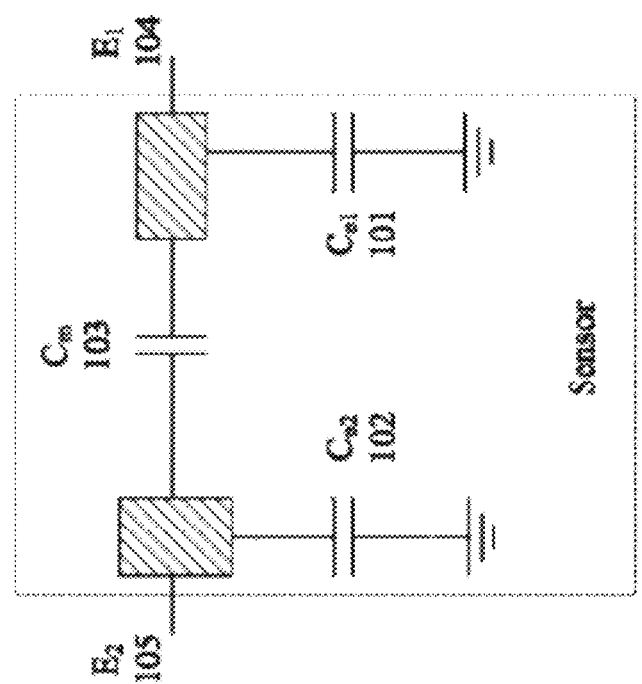
FIG. 1 illustrates two electrodes situated close to each other, according to one embodiment.

In the following description, for purposes of explanation, numerous specific details are set forth in order to provide a thorough understanding of embodiments of the present invention. It will be evident, however, to one skilled in the art that embodiments of the present invention may be practiced without these specific details. In other instances, well-known circuits, structures, and techniques are not shown in detail or are shown in block diagram form in order to avoid unnecessarily obscuring an understanding of this description.

Reference in the description to "one embodiment" or "an embodiment" means that a particular feature, structure, or characteristic described in connection with the embodiment is included in at least one embodiment of the invention. The appearances of the phrase "in one embodiment" in various places in the specification do not necessarily all refer to the same embodiment. Like reference numerals denote like references elements throughout.

A capacitive sensor may be characterized by a base capacitance that includes a self capacitance component and a mutual capacitance component. Since the values of these capacitance components affect the operation of the capacitive touch sensor and may vary from one capacitive sensor to another, a capacitive sensing circuit may benefit from the capability of independently measuring the self and mutual capacitances of a capacitive sensor.

Apparatus for and methods of measuring mutual and self capacitance in a capacitive touch sensor are described. The apparatus and methods described herein may be used in capacitive touch detection systems such as, for example, capacitive touch screens and, in particular, with capacitive touch screens having multiple simultaneous touch detection capabilities. Alternatively, the apparatus and methods described herein may be used with single touch detection systems or other types of capacitive touch systems.

The capacitance measurement circuits described herein may be used for touch detection in single electrode systems, transmit/receive (TX-RX) systems, or in combined TX-RX and single electrode systems. The TX-RX systems can use the mutual capacitance change detection, and single electrode systems can use the self capacitance change detection. In some embodiments, additional multiplexers can be added for multiple electrode scanning. In other embodiments additional capacitance-to-current converters may be added to allow parallel scanning of multiple sensor electrodes. The capacitance measurement circuits described herein may be used in various applications including, for example, single button applications, multiple buttons applications, linear and radial sliders, dual dimension touchpads and touchscreens, and multi-touch touchpad and touchscreen applications. Multi-touch touchpad and touchscreen systems are composed of a matrix of RX and TX electrodes, where the presence (e.g., touch) of a finger (or other conductive object) is detected as a decrease in the mutual capacitance at the intersection of the TX-RX electrodes.

Embodiments of the present invention allow for measurement of two or more 'electrodes' mutual and self capacitance separately. Capacitance measurement can be performed with a single pair of electrodes or with the use of a multiple electrode system. Two electrodes situated close to each other are shown at FIG. 1, where $C_{e1}$ 101 and $C_{e2}$ 102 are electrode self capacitances, and $C_m$ 103 is the mutual capacitance between the two electrodes $E_1$ 104 and $E_2$ 105.

Figure 2:
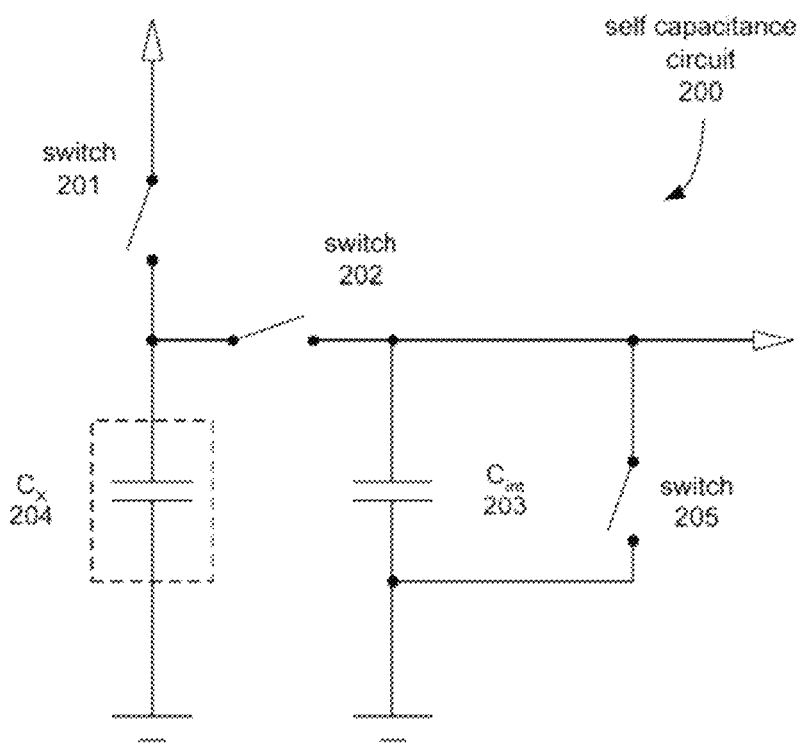
FIG. 2 illustrates one embodiment of a self-capacitance circuit that uses a charge accumulation technique.

There are various circuit implementations that may be used for performing capacitance measurement. FIG. 2 illustrates a self-capacitance circuit 200 that uses a charge accumulation technique to measure the capacitance $C_x$ 204. A charge accumulation technique operates in the following way: initially the integration capacitor 203 is reset by turning on a reset signal for some time which sets switch 205 such that both ends of integration capacitor 203 are grounded. After reset, the switches 201 and 202 start operation in the two non-overlapping phases, wherein switch 201 when closed accumulates charge onto $C_x$ and wherein switch 202 when closed allows that charged to be integrated onto $C_{int}$ 203. As more charge is integrated onto integration capacitor $C_{int}$ 203, the voltage on $C_{int}$ 203 starts increasing. The sensing capacitance may be determined by the number of switching cycles used to get the integrator capacitor voltage to some threshold value, such as $V_{DD}/2$ or a bandgap voltage ($V_{BG}$).

With such a charge accumulation technique, the voltage on the integration capacitance rises exponentially with respect to time (said time can be measured by a count of the number of cycle it takes to reach the threshold value). This relationship can be linearized for measurement methods where capacitance is calculated as a function of integration capacitor voltage after a predefined number of cycles. Also, the mutual capacitance measurement scheme has some sensitivity to the sensor self capacitance, which decreases the measurement accuracy.

Figure 3:
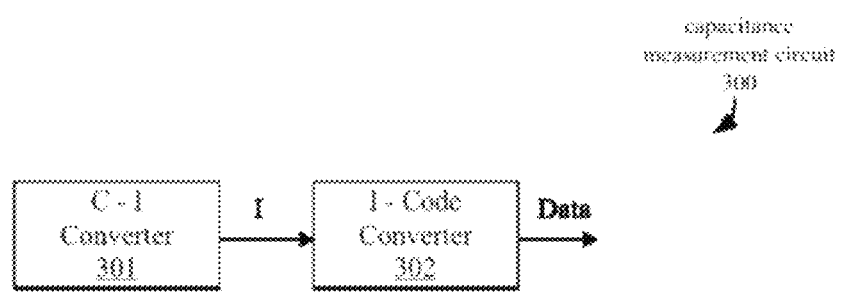
FIG. 3 illustrates a block diagram of an apparatus for measuring mutual or self capacitance, according to one embodiment.

FIG. 3 illustrates a block diagram of a capacitance measurement circuit 300 for measuring mutual or self capacitance, according to one embodiment of the present invention. The apparatus illustrated in FIG. 3 can be used for separately measuring mutual or self capacitances of a capacitance sensor. In order to measure a mutual capacitance, the $C_{31}$, $C_{e2}$ (of FIG. 1) capacitance influence should be excluded. This can be accomplished by charging and discharging the $C_{e2}$ electrode from a low-impedance voltage source and keeping the voltage of the $C_{e1}$ electrode close to constant to minimize the influence of its charge-discharge current. In order to measure the self-capacitance (of $C_{e1}$ or $C_{e2}$) the voltage change across $C_m$ should be kept to zero to minimize the influence of this capacitance on the measurement results.

The capacitance measurement circuit 300 can be separated into two parts: the switching capacitor front-end capacitance-to-current converter 301, and the back-end current-to-digital value converter 302, as illustrated in FIG. 3. In the following description, the front-end and back-end circuits are described separately. A switching capacitor front-end converts the sensing capacitance to current pulses. The back-end system averages the current and converts it into readable digital values. The circuits described herein are based on a switching capacitor technique in capacitance-to-current converter circuits.

FIGS. 4A, 4B, 5A and 5B show different embodiments for a capacitance to current converter for mutual capacitance measurement. In the referenced figures, a voltage buffer 401 resides between the integration capacitor $C_{int}$ 406 and the switches 402, 404 connecting to the mutual electrodes of the capacitance-to-current. It should be noted that the integration capacitor $C_{int}$ 406 is considered as part of the current measurement system and shown here for ease of explanation. The integration capacitor 406 can be connected between the converter output and a fixed potential net, for example, GND and $V_{CC}$, as illustrated in FIGS. 4A, 4B, 5A and 5B, respectively.

The operation of the circuit may be described in several stages, which are repeated in cycle. Table 1 contains the switching sequence of switches for the circuits shown in FIGS. 4A and 4B.

TABLE 1

Figure 4A:
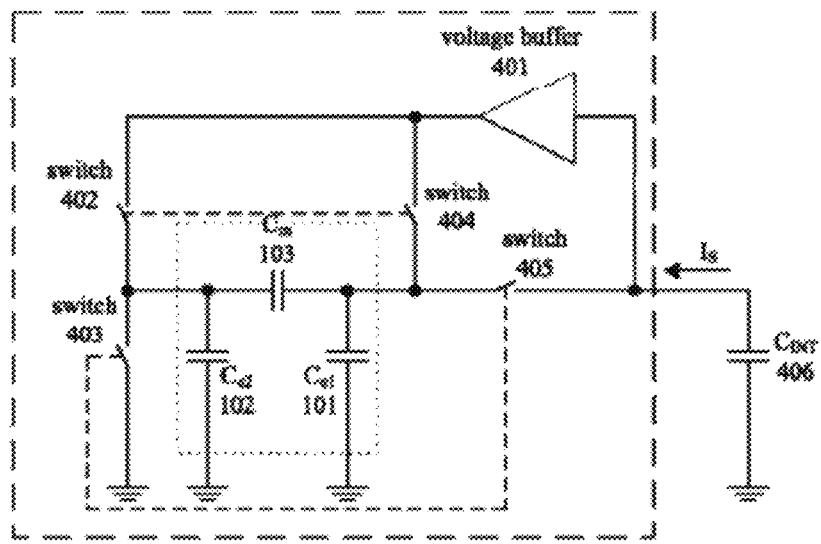
FIG. 4A illustrates one embodiment of a capacitance to current sink converter having an integration capacitor coupled to ground.
Figure 4B:
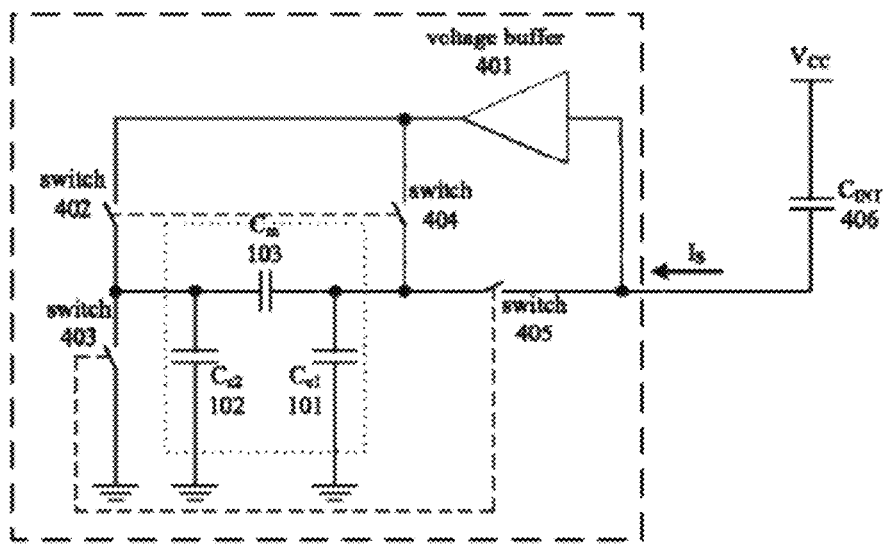
FIG. 4B illustrates one embodiment of a capacitance to current sink converter having an integration capacitor coupled to a high voltage supply potential.

Switching sequence of switches shown in FIGS. 4A and 4B.

| Stage | Switch 402 | Switch 403 | Switch 404 | Switch 405 | $U_{Cint}$, $U_{Ce1}$, $U_{Ce2}$, $U_{Cm}$ |
|---|---|---|---|---|---|
| 1 | OFF | OFF | OFF | OFF | $U_{Cint} = U_0$ |
| 2 | ON | OFF | ON | OFF | $U_{Cm} = 0$, $U_{Ce1} = U_{Ce2} =$ $C_{Cint} = U_{buf}$ |
| 3 | OFF | OFF | OFF | OFF | $U_{Cint} = 0$, $U_{Ce1} = U_{Ce2} = U_{Cint}$ |

TABLE 1-continued

Switching sequence of switches shown in FIGS. 4A and 4B.

| Stage | Switch 402 | Switch 403 | Switch 404 | Switch 405 | $U_{Cint}$, $U_{Ce1}$, $U_{Ce2}$, $U_{Cm}$ |
|---|---|---|---|---|---|
| 4 | OFF | ON | OFF | ON | $U_{Cm} = U_{Cint} = U_{Ce1}$, $U_{Ce2} = 0$ |
| 5 | OFF | OFF | OFF | OFF | $U_{Cm} = U_{Ce1}$, $U_{Ce2} = 0$ |

Figure 5A:
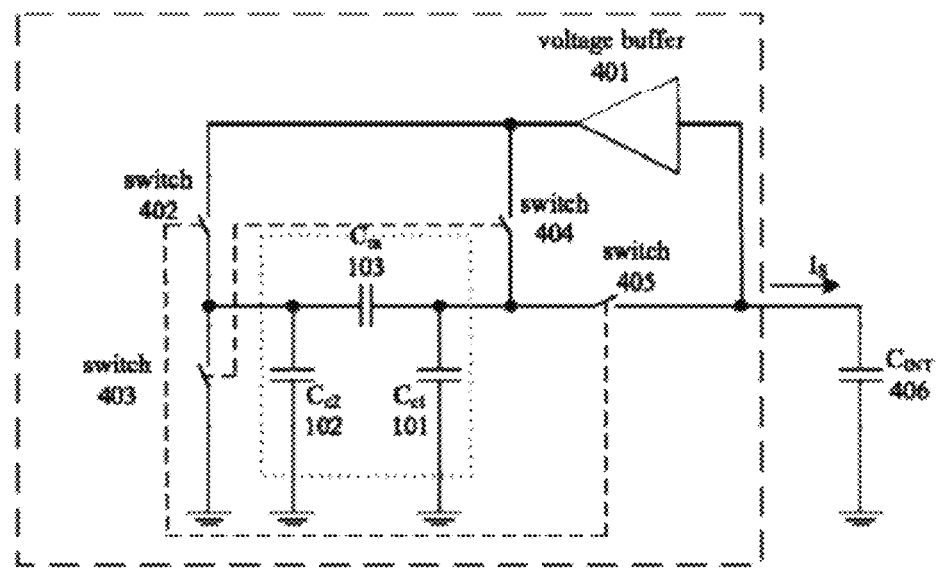
FIG. 5A illustrates one embodiment of a capacitance to current source converter having an integration capacitor coupled to ground.
Figure 5B:
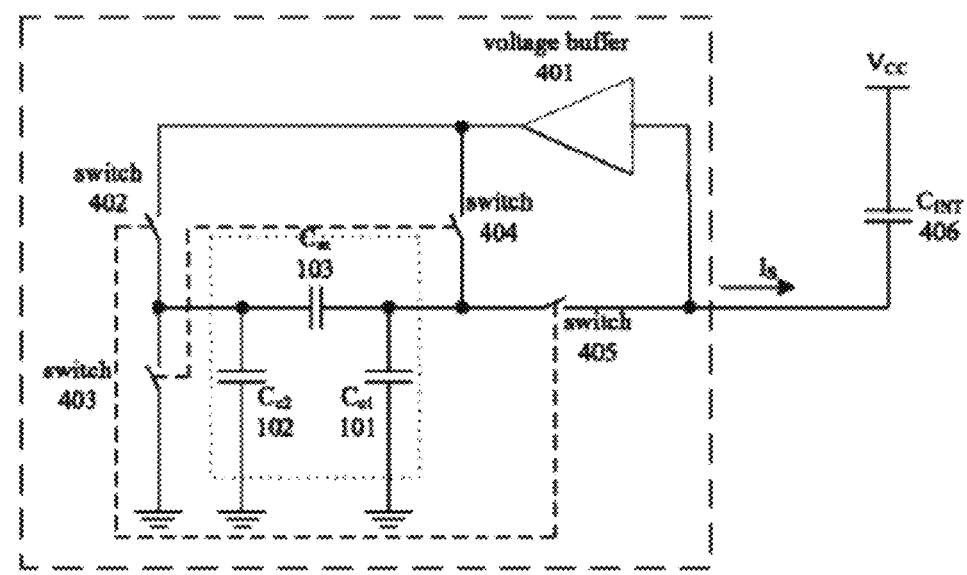
FIG. 5B illustrates one embodiment of a capacitance to current source converter having an integration capacitor coupled to a high voltage supply potential.

Table 2 contains the switching sequence of switches for the circuits shown in FIGS. 5A and 5B.

TABLE 2

Switching sequence of switches shown in FIGS. 5A and 5B.

| Stage | Switch 402 | Switch 403 | Switch 404 | Switch 405 | $U_{Cint}$, $U_{Ce1}$, $U_{Ce2}$, $U_{Cm}$ |
|---|---|---|---|---|---|
| 1 | OFF | OFF | OFF | OFF | $U_{Cint} = U_0$ |
| 2 | OFF | ON | ON | OFF | $U_{Cm} = U_{buf} = U_{Cint} = U_{Ce1}$ |
| 3 | OFF | OFF | OFF | OFF | $U_{Cm} = U_{Cint} = U_{Ce1}$ |
| 4 | ON | OFF | OFF | ON | $U_{Cm} = 0$, $U_{Ce1} = U_{Cint}$, $U_{Ce2} = U_{Cint}$ |
| 5 | OFF | OFF | OFF | OFF | $U_{Cm} = 0$, $U_{Ce1} = U_{Cint}$, $U_{Ce2} = U_{Cint}$ |

The stages from 2 to 5 are performed in cycles. In effect, the circuits shown in FIGS. 4A and 4B may act as current sinks, and the circuits shown in FIGS. 5A and 5B may act as current sources in the respective embodiment. The integration capacitor $C_{int}$ 406 is external to the capacitance-to-current converter and is not part of the current measurement circuit.

Figure 6A:
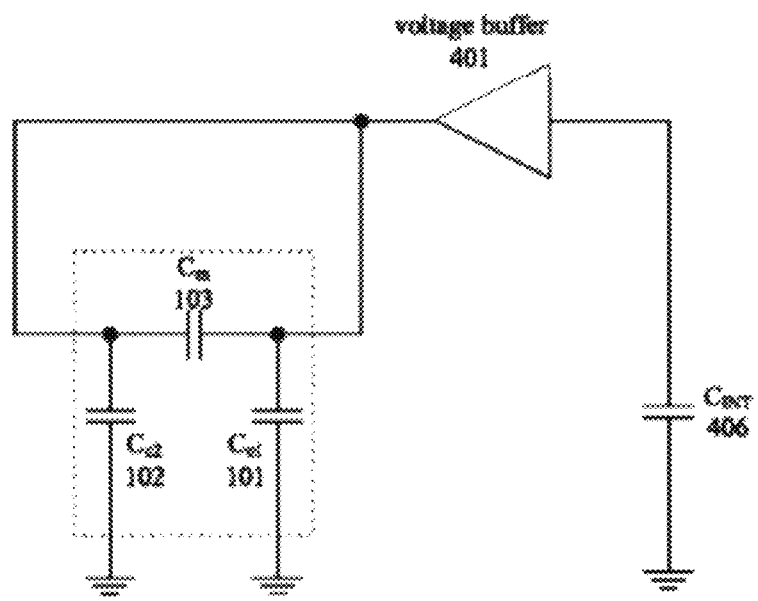
FIG. 6A illustrates a first phase of a converter operation, according to one embodiment.
Figure 6B:
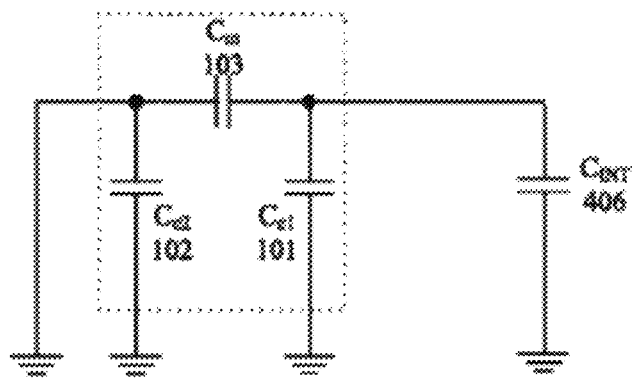
FIG. 6B illustrates a second phase of a converter operation, according to one embodiment.

FIGS. 6A and 6B illustrates one embodiment of the operation phases for the circuits shown in FIGS. 4A and 4B, respectively. During the first phase (FIG. 6A), both ends of the $C_m$ 103 are connected to voltage buffer 401. During the second phase (FIG. 6B), the left $C_m$ terminal is grounded and the right terminal is connected to the integration capacitor $C_{int}$ 406.

For both circuits, an averaged absolute current sink/source ($I_S$) value can be calculated by Equation 1:

$$I_S = f_{sw} \cdot U_{Cint} \cdot C_m \quad (1)$$

where, $f_{sw}$ is the switching frequency of phases 2-5 repeating. It should be noted that the capacitance of $C_{e2}$ electrode 102 is shunted by switch 402 or 403 in each operation phase and does not have an impact on the output current. The capacitance of the $C_{e1}$ electrode 101 has a potential equal to $U_{Cint}$ during both charge transfer stages and is not recharged between different operation phases. Therefore, the output current is determined by the value of $C_m$ 103 and the potential applied across it.

A special case of the capacitance-to-current converter operation is now considered, when it is loaded by stand-alone integration capacitor $C_{int}$ 406. In this case, the relationship between the voltage change on $U_{Cint}$ and the cycles count N has a nonlinear exponential character, as expressed in Equation 2:

$$U_{Cint}^N = U_{Cint}^0 \cdot \left(1 - \frac{C_m}{C_{int}}\right)^N \quad \left(U_{Cint}^N \approx U_{Cint}^0 \cdot e^{-N \frac{C_m}{C_{int}}}\right) \quad (2)$$

where, N is the quantity of conversion cycles and $U_{Cint}^0$ is the voltage on the integration capacitor 406 at the initial time.

The exponential character of this dependence is caused by the positive voltage feedback via buffer 401: increasing voltage on the integration capacitor 406 (when the capacitance-to-current converter is configured as a current source) causes a larger charge quantum being moved in each phase and an increase in the speed of the integration capacitor 406 voltage rising. The current measurement circuit may not keep a voltage on the integration capacitor 406 constant in this embodiment.

The circuit embodiments illustrated in FIGS. 7A, 7B, 8A, and 8B may be used to keep voltage on $C_{int}$ 406 constant. The difference between the circuit embodiments illustrated in FIGS. 7A, 7B, 8A, and 8B, versus those illustrated in FIGS. 4A, 4B, 5A, and 5B, is that the left terminal of $C_m$ 103 is connected to the fixed voltage source $V_{DD}$ in FIGS. 7A, 7B, 8A and 8B. In FIGS. 7A, 7B, 8A and 8B the variable buffer output voltage of an analog buffer 701 is coupled to the right terminal of $C_m$ 103 and in FIGS. 4A, 4B, 5A and 5B buffer 401 is coupled with the left terminal of $C_m$ 103. Only the switch 702 connection is changed on the circuits illustrated in FIGS. 7A, 7B, 8A, and 8B.

Figure 7A:
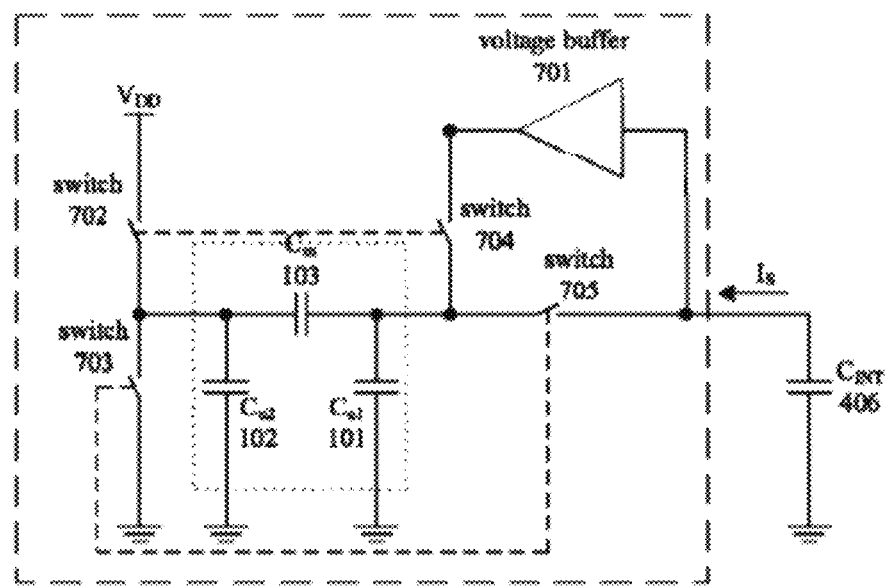
FIG. 7A illustrates one embodiment of a capacitance to current sink converter used for mutual capacitance measurement, having an integration capacitor coupled to ground.
Figure 7B:
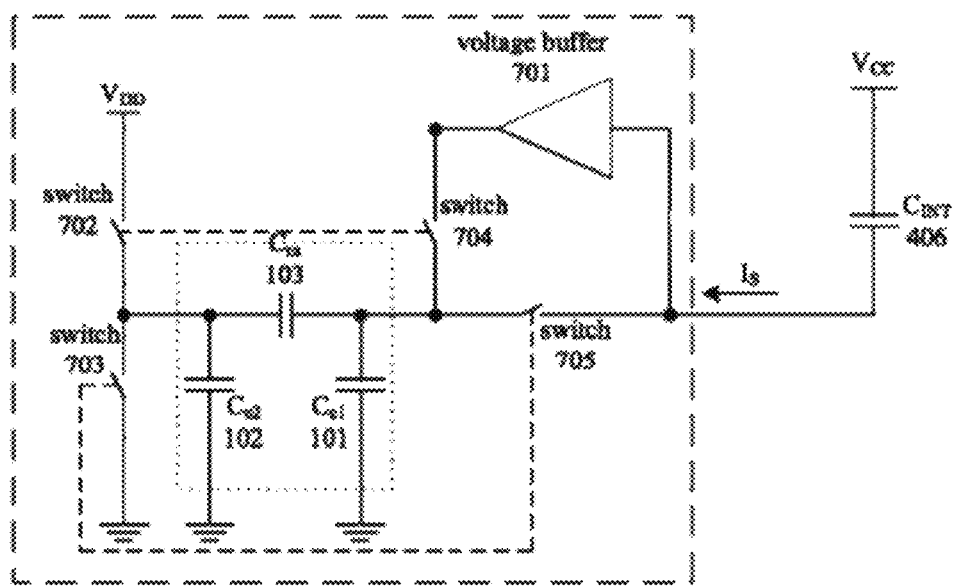
FIG. 7B illustrates one embodiment of a capacitance to current sink converter used for mutual capacitance measurement, having an integration capacitor coupled to $V_{DD}$.

The switching sequence of the switches illustrated in FIGS. 7A and 7B is shown in Table 3.

TABLE 3

Switching sequence of switches in FIGS. 7A and 7B.

| Stage | Switch 702 | Switch 703 | Switch 704 | Switch 705 | $U_{Cint}$, $U_{Ce1}$, $U_{Ce2}$, $U_{Cm}$ |
|---|---|---|---|---|---|
| 1 | OFF | OFF | OFF | OFF | $U_{Cint} = U_0$ |
| 2 | ON | OFF | ON | OFF | $-U_{Cm} = U_{Vdd} - U_{Cint}$, $U_{Ce1} = U_{Cint} = U_{buf}$, $U_{Ce2} = U_{Vdd}$ |
| 3 | OFF | OFF | OFF | OFF | $U_{Cm} = U_{Vdd} - U_{Cint}$, $C_{Ce1} = U_{Cint}$, $U_{Ce2} = U_{Vdd}$ |
| 4 | OFF | ON | OFF | ON | $U_{Cm} = U_{Cint} = U_{Ce1}$, $U_{Ce2} = 0$ |
| 5 | OFF | OFF | OFF | OFF | $U_{Cm} = U_{Ce1}$, $U_{Ce2} = 0$ |

Figure 8A:
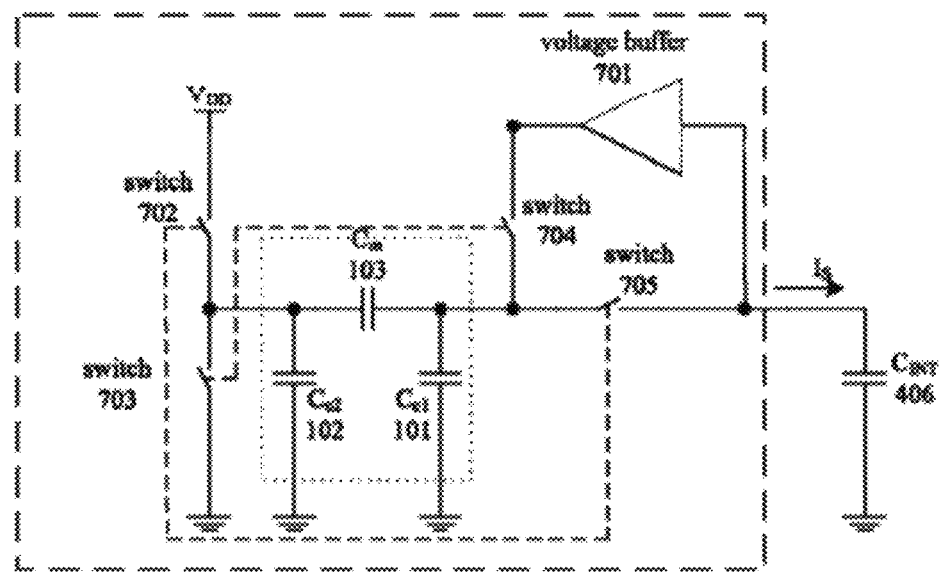
FIG. 8A illustrates one embodiment of a capacitance to current source converter having an integration capacitor coupled to ground.
Figure 8B:
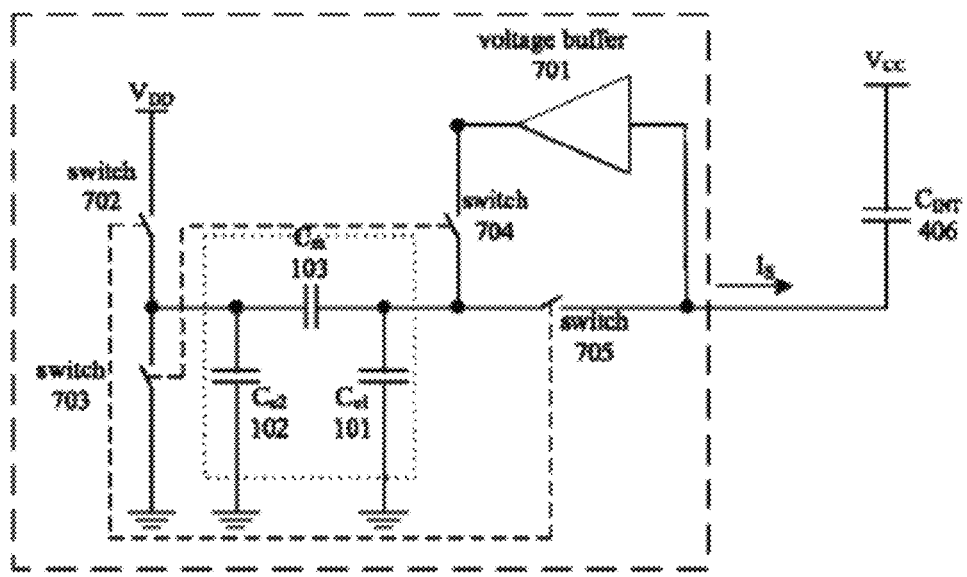
FIG. 8B illustrates one embodiment of a capacitance to current source converter having an integration capacitor coupled to a high voltage supply potential.

The switching sequence of the switches illustrated in FIGS. 8A and 8B is shown in Table 4.

TABLE 4

Switching sequence of switches in FIGS. 8a and 8b

| Stage | Switch 702 | Switch 703 | Switch 704 | Switch 705 | $U_{Cint}$, $U_{Ce1}$, $U_{Ce2}$, $U_{Cm}$ |
|---|---|---|---|---|---|
| 1 | OFF | OFF | OFF | OFF | $U_{Cint} = U_0$ |
| 2 | OFF | ON | ON | OFF | $U_{Cm} = U_{buf} = U_{Cint} = U_{Ce1}$ |
| 3 | OFF | OFF | OFF | OFF | $U_{Cm} = U_{Cint} = U_{Ce1}$ |
| 4 | ON | OFF | OFF | ON | $-U_{Cm} = U_{Vdd} - U_{Cint}$, $U_{Ce1} = U_{Cint}$, $U_{Ce2} = U_{Vdd}$ |
| 5 | OFF | OFF | OFF | OFF | $U_{Cm} = 0$, $U_{Ce1} = U_{Cint}$, $U_{Ce2} = U_{Vdd}$ |

The stages from 2 to 5 are performed in cycles. As a result, the average current flowing out of the $C_{int}$ 406 capacitor for the circuits on FIGS. 7A, 7B, 8A, and 8B may be calculated by Equation 3:

$$I_S = f_{sw} \cdot U_{Vdd} \cdot C_m \quad (3)$$

For the given values of $f_{sw}$ and $V_{DD}$ parameters, the output current ($I_S$) linearly depends on $C_m$ and is proportional to $f_{sw}$ and $V_{DD}$ in this embodiment. The change of current direction is done by a change of the switches' operation phases. If the current measurement subsystem does not load the integration capacitor $C_{int}$ 406, a voltage on this capacitor changes linearly with the number of cycles N, as expressed in Equation 4:

$$U_{Cint}^N = U_{Vdd} \cdot \left(1 - N \cdot \frac{C_m}{C_{int}}\right) \quad (4)$$

A similar Equation 5 is used for describing the circuits illustrated in FIGS. 8A and 8B:

$$U_N = N \cdot U_{Vdd} \cdot \frac{C_m}{C_{int}} \quad (5)$$

The mutual capacitance circuit embodiments described previously may be used for self-capacitance measurement with minimal hardware changes by routing the buffer signal to the left-side switches. To do this, the switched voltages may be adjusted in such a way that the voltage change on the mutual capacitance $C_m$ is equal to zero between different phases. In other circuit configurations, the voltage on $C_{e2}$ is kept constant but the voltage on $C_m$ is varied. In the circuit embodiments illustrated in FIGS. 7A, 7B, 8A, and 8B, the voltage on $C_{e2}$ is varied and the voltage change on $C_m$ is kept constant.

Figure 9A:
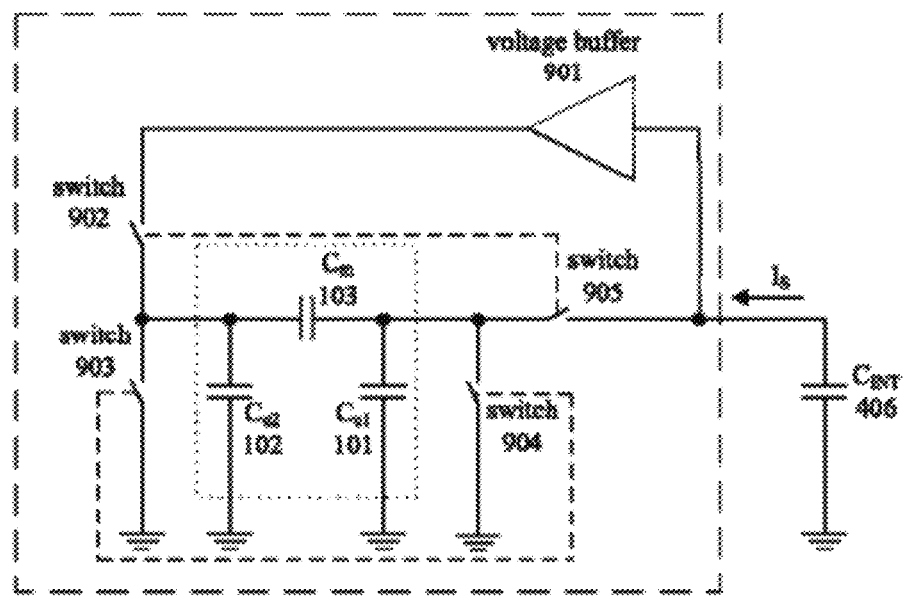
FIG. 9A illustrates one embodiment of a capacitance to current sink converter used for self capacitance measurement, having an integration capacitor coupled to ground.
Figure 9B:
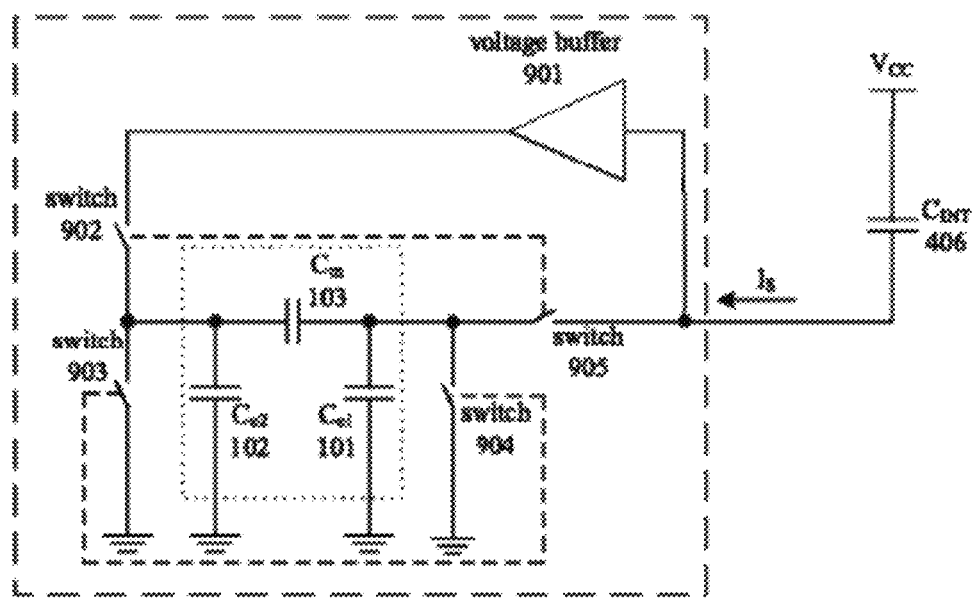
FIG. 9B illustrates one embodiment of a capacitance to current sink converter used for self capacitance measurement, having an integration capacitor coupled to a high voltage supply potential.

FIGS. 9A and 9B illustrate embodiments of a capacitance to current sink converter for self capacitance measurement. As previously noted, the integration capacitor $C_{int}$ 406 is considered part of the current measurement system and is shown here for ease of explanation. The integration capacitor 406 can be connected between the converter output and any fixed potential net, for example, GND and $V_{CC}$, as illustrated in FIGS. 9A and 9B respectively. Alternatively, the integration capacitor 406 can be connected between the converter output and other fixed potentials.

The switching sequence of switches illustrated in the circuit of FIGS. 9A and 9B is shown in Table 5.

TABLE 5

Switching sequence of switches illustrated in FIGS. 9A, 9B.

| Stage | Switch 902 | Switch 903 | Switch 904 | Switch 905 | $U_{Cint}, U_{Ce1}, U_{Ce2}, U_{Cm}$ |
|---|---|---|---|---|---|
| 1 | OFF | OFF | OFF | OFF | $U_{Cint} = U_0$ |
| 2 | OFF | ON | ON | OFF | $U_{Ce1} = U_{Ce2} = 0, U_{Cm} = 0$ |
| 3 | OFF | OFF | OFF | OFF | $U_{Ce1} = U_{Ce2} = 0, U_{Cm} = 0$ |
| 4 | ON | OFF | OFF | ON | $U_{e1} = U_{Cint} = U_{Ce2}, U_{Cm} = 0$ |
| 5 | OFF | OFF | OFF | OFF | $U_{e1} = U$ |

Figure 10A:
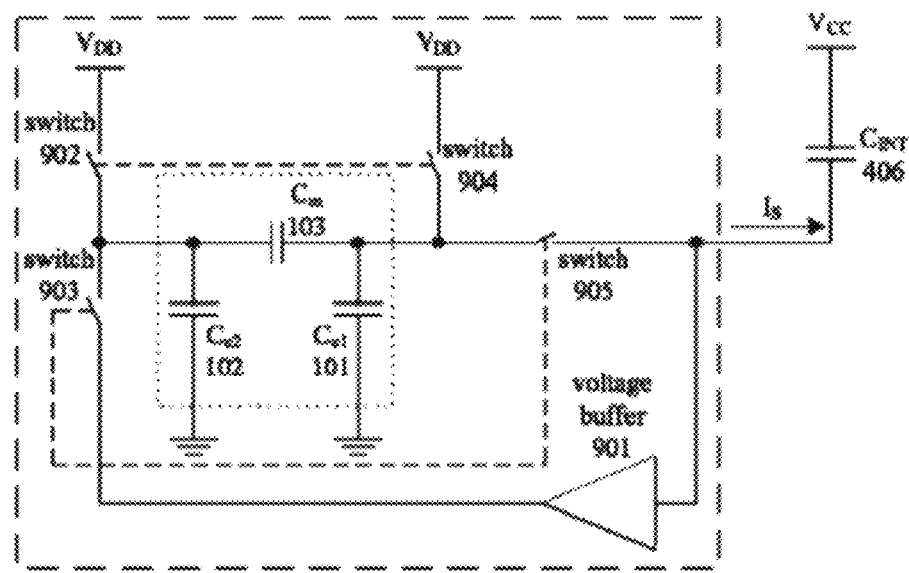
FIG. 10A illustrates one embodiment of a capacitance to current source converter used for self capacitance measurement, having an integration capacitor coupled to a high voltage supply potential.
Figure 10B:
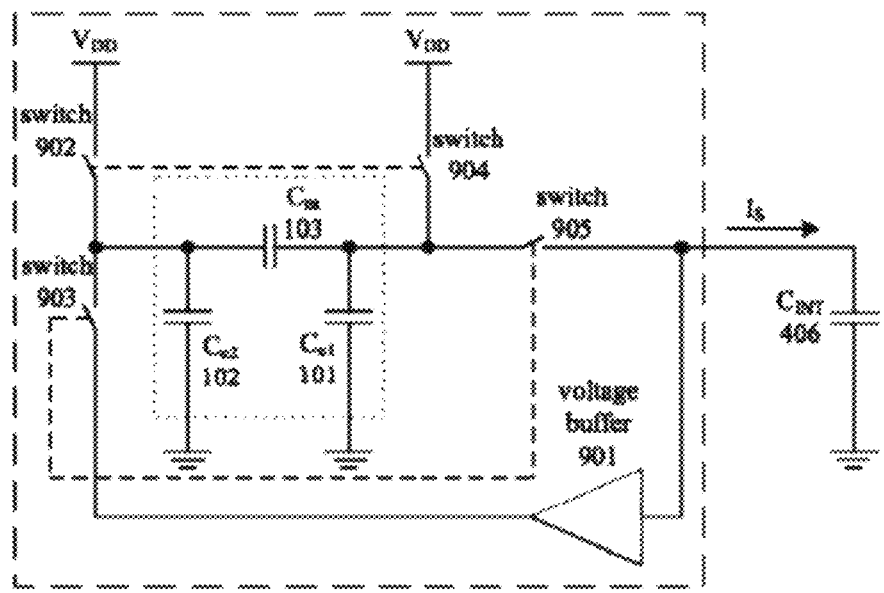
FIG. 10B illustrates one embodiment of a capacitance to current source converter used for self capacitance measurement, having an integration capacitor coupled to ground.

FIGS. 10A and 10B illustrate embodiments of a capacitance to current source converter for self capacitance measurement. As previously noted, the integration capacitor $C_{int}$ 406 is considered part of the current measurement system and is shown here for ease of explanation. The integration capacitor 406 can be connected between the converter output and any fixed potential net, for example, GND and $V_{CC}$, as illustrated in FIGS. 10A and 10B respectively. Alternatively, the integration capacitor 406 can be connected between the converter output and other fixed potentials.

The switching sequence of switches in FIGS. 10A and 10B is shown in Table 6.

TABLE 6

Switching sequence of switches illustrated in FIGS. 10A, 10B.

| Stage | Switch 902 | Switch 903 | Switch 904 | Switch 905 | $U_{Cint}, U_{Ce1}, U_{Ce2}, U_{Cm}$ |
|---|---|---|---|---|---|
| 1 | OFF | OFF | OFF | OFF | $U_{Cint} = U_0$ |
| 2 | ON | OFF | ON | OFF | $U_{Ce1} = U_{Ce2} = U_{Vdd}, U_{Cm} = 0$ |
| 3 | OFF | OFF | OFF | OFF | $U_{Ce1} = U_{Ce2} U_{Vdd}, U_{cm} = 0$ |
| 4 | OFF | ON | OFF | ON | $U_{e1} = U$ |
| 5 | OFF | OFF | OFF | OFF | $U_{e1} = U_{Cint} = U_{Ce2}, U_{Cm} = 0$ |

Stages 2 through 5 are performed in cycles. As a result, the average current flowing out of capacitor $C_{int}$ for the circuits illustrated in FIGS. 9A and 9B may be described by Equation 6:

$$I_S = f_{sw} \cdot U_{Cint} \cdot C_{e1} \quad (6)$$

The average current flowing into $C_{int}$ capacitor for the circuits illustrated in FIGS. 10A and 10B may be described by Equation 7:

$$I_S = f_{sw} \cdot (U_{Vdd} - U_{Cint}) \cdot C_{e1} \quad (7)$$

The potential difference on electrode capacitor $C_m$ 103 is equal to approximately zero during the stages of charge transfer and does not have an impact on the measurement in this embodiment. The $C_{e2}$ electrode 102 capacitance is switched off by switches 902 and 904 during the stages of operation. In this case, the relationship between the voltage change on $U_{Cint}$ and the cycle count N has a nonlinear exponential character for the circuits illustrated in FIGS. 9A and 9B, in accord with Equation 8:

$$U_{Cint}^N = U_{Cint}^0 \cdot \left(1 - \frac{C_{e1}}{C_{int}}\right)^N \quad (8)$$

Equation 9 similarly describes the circuits illustrated in FIGS. 10A and 10B:

$$U_{Cint}^N = U_{Vdd} \cdot \left(1 - e^{-N\frac{C_{e1}}{C_{int}}}\right) \quad (9)$$

Various alternative variants of the conversion circuits described above may be used. Alternative conversion circuits include integration circuits such as time measurement of the integration capacitor voltage threshold crossing, current integrations with an operational amplifier as a current integrator. Alternative conversion circuits include analog-to-digital circuits such as a current-to-voltage conversion using an operational amplifier and an ADC voltage measurement device or sigma-delta modulation circuits.

Figure 11:
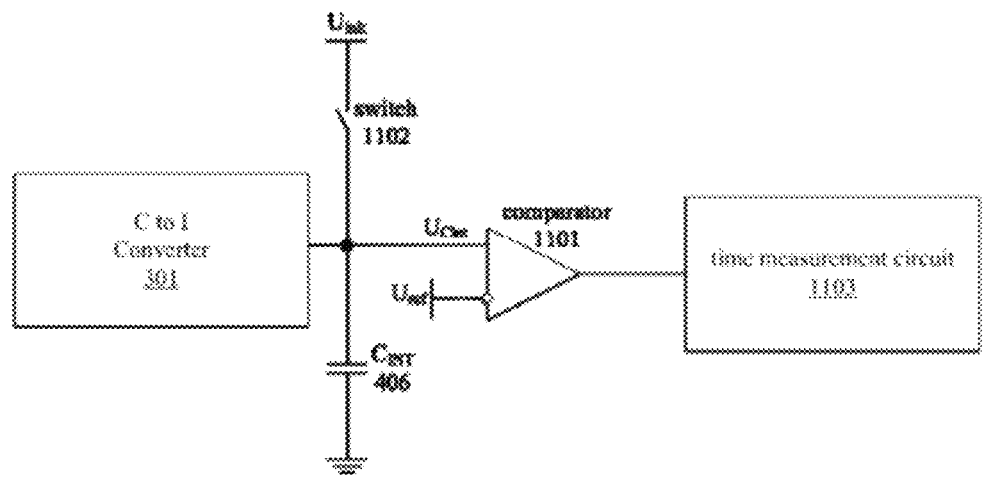
FIG. 11 illustrates one embodiment of an interval timer method for capacitance measurement.

FIG. 11 illustrates an interval timer method for capacitance measurement. In the circuit of FIG. 11, the integrator consists of a capacitor 406. The circuit of FIG. 11 operates in the following way. Initially, the voltage of integration capacitor 406 is set to by turning on, for some time period, a switch 1102. The comparator 406 is used as threshold circuit and compares the voltage on the integration capacitor 406 with a reference voltage $U_{ref}$. The capacitance is measured by the time measurement circuit 1103 as the time elapsed (in the cycles count) until the comparator 1101 is triggered. The time is inversely proportional to the capacitance-to-current converter current in this embodiment. It should be noted that for switching capacitor current sink schemes, an integrator initial voltage ($U_{init}$) is set higher than the threshold voltage ($U_{ref}$).

For the current source schemes, the integrator initial voltage is lower than threshold voltage $U_{ref}$.

Figure 12:
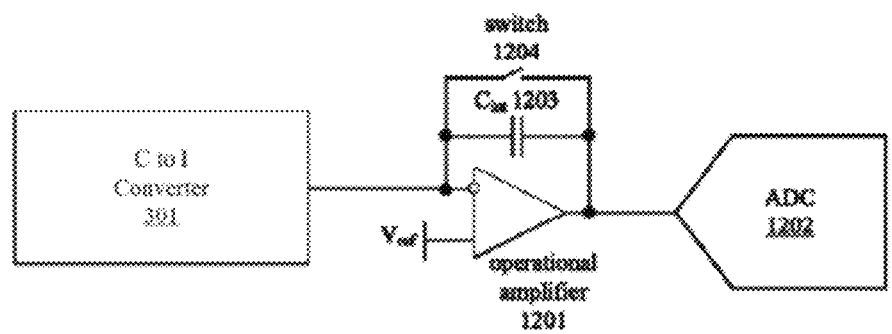
FIG. 12 illustrates one embodiment of a resettable current integrator with an operation amplifier and an analog-to-digital converter (ADC)
Figure 13:
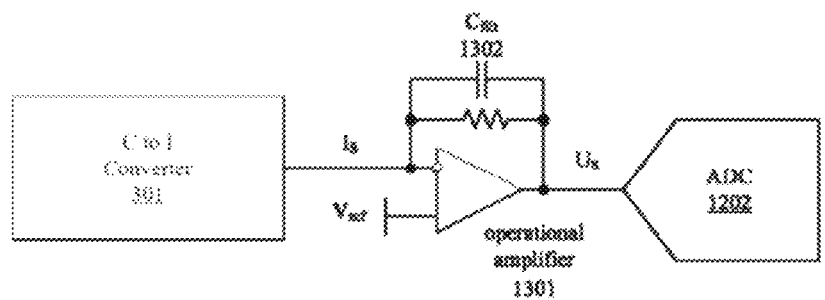
FIG. 13 illustrates one embodiment of a current-to-voltage converter built around an operational amplifier.

For more accurate current conversion, circuits based on current-to-voltage converters and current integrators may be used, as illustrated in FIGS. 12 and 13. FIG. 12 illustrates one embodiment of a resettable current integrator (where integration capacitor 1203 can be reset using switch 1204) with an operational amplifier 1201 with reference input voltage $V_{ref}$ and an analog-to-digital converter (ADC) 1202 coupled to the output of operational amplifier 1201. The ADC 1202 is used for integrator voltage measurement after the completion of a predefined number of integration cycles. Capacitance on the is converted to current by capacitance-to-current converter 301 and $C_{int}$ 203 is charged with the output current to Vref on the operational amplifier 1201. The output of operational amplifier 1201 coupled to the opposite side of $C_{int}$ 1203 is then measured by ADC 1202 to calculate the value of the capacitance in the capacitance-to-current converter 301.

Figure 14:
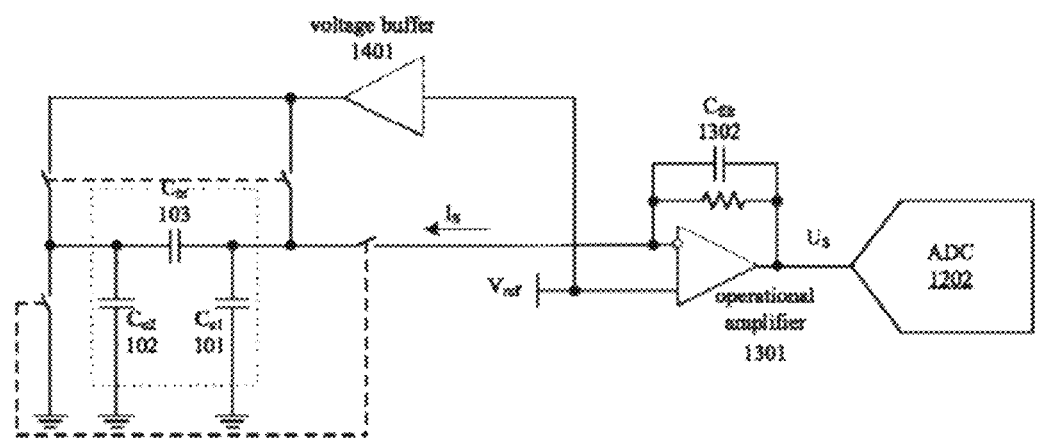
FIG. 14 illustrates one embodiment of a capacitance to current converter with a conversion circuit.

FIG. 13 illustrates one embodiment of a current-to-voltage converter built around an operational amplifier 1301. The converter of FIG. 13 also functions as a low pass filter (LPF) due to the presence of the filter capacitor $C_{filt}$ 1302 in the amplified feedback path. The output voltage $U_S$ is proportional to the input current $I_S$. The circuit of FIG. 13 operates continuously such that ADC conversion can be started any time after transient signals have stabilized. It should be noted that the buffer input inside the capacitance-to-code converter can be connected to the $V_{ref}$ net for the circuits illustrated in FIGS. 12 and 13, taking into account that both operational amplifier inputs have approximately the same potential. The schematic diagram of such a circuit configuration is illustrated in FIG. 14, where the input of voltage buffer 1401 is connected to the $V_{ref}$ net.

Figure 15:
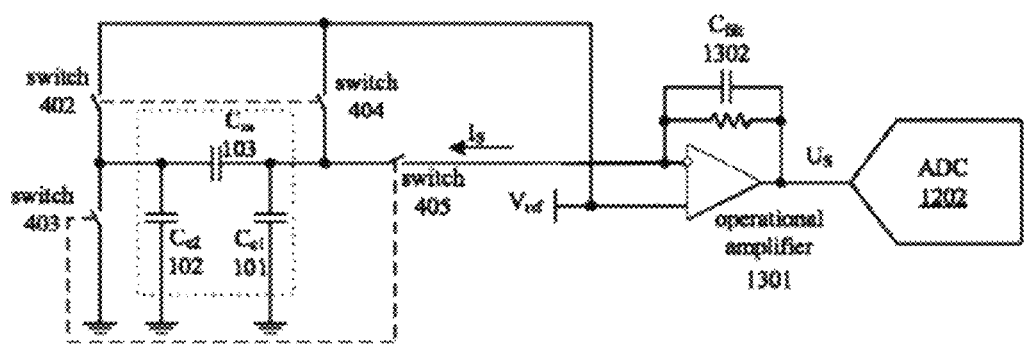
FIG. 15 illustrates one embodiment of a capacitance to current converter with a low-pass filter.

In an alternative embodiment, when the $V_{ref}$ voltage source has an acceptable low output resistance, then the voltage buffer 1401 may be eliminated from the circuits illustrated herein. As an example, the circuit from FIG. 4 composed of the measurement circuit of FIG. 13 is illustrated in FIG. 15. Accordingly, FIG. 15 is an example illustration of a capacitance-to-code converter with a low-pass filter that can be implemented without a voltage buffer 1401 coupled to the reference voltage source $V_{ref}$. In one embodiment, the reference voltage $V_{ref}$ used to supply the switches in the capacitance-to-current converter is selected to be as close to $V_{DD}$ as possible (limited by the working range of the operational amplifier 1301), to minimize the current flow out of $C_{e2}$ 102 relative to the current flowing through $C_m$ 103. In alternative embodiments, the switches in the converters can be supplied with other known voltages such as, for example, $V_{DD}$.

Figure 16:
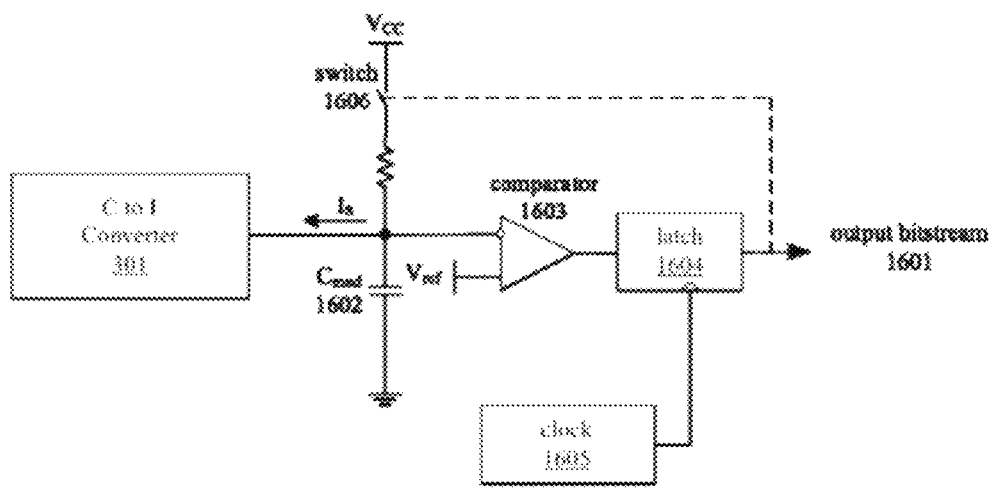
FIG. 16 illustrates one embodiment of a sigma-delta modulator configured as a capacitance to duty cycle converter.

The sigma-delta modulator circuits can be effectively used for the current-to-code conversion. An advantage of the sigma-delta modulator circuits is their integrative nature. FIG. 16 illustrates one possible example of a modulator implementation for a first order modulator. It should be noted that higher order modulator circuits can be used as well. The sigma-delta modulator of FIG. 16 converts the current $I_S$ to a code in output bitstream 1601. The current $I_S$ discharges modulation capacitor $C_{mod}$ 1602 until the voltage at $C_{mod}$ 1602 falls below $V_{ref}$, at which point comparator 1603 asserts its output to latch 1604, which outputs bits synchronously with a clock signal provided by clock 1605. The latch 1604 then closes switch 1606 to recharge $C_{mod}$ 1602 at a rate faster than it is being discharged by current $I_S$. When the voltage at $C_{mod}$ 1602 rises above $V_{ref}$, comparator 1603 de-asserts its output to latch 1604, which then opens synchronously to open switch 1606, allowing current $I_S$ to again discharge $C_{mod}$ 1602. This toggling of state of latch 1604 provides the bitstream 1601 which may then be evaluated to provide a digital-code equivalent of the measured capacitance.

Figure 17:
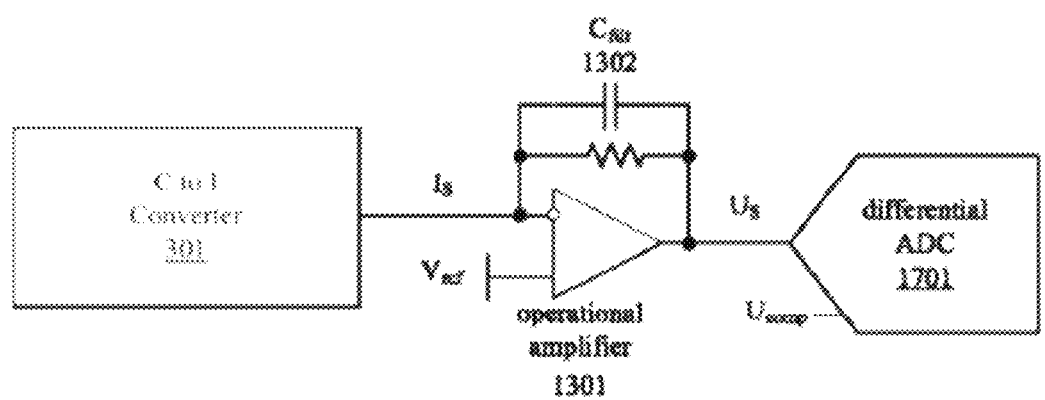
FIG. 17 illustrates one embodiment of a low pass filter with a differential analog to digital converter.

In one embodiment, the capacitance measurement circuit embodiments described previously may be used in touch sensitive devices. With such devices, a small capacitance change should be detected over the presence of large base capacitance. Such sensors have two components of capacitance, described in Equation 10:

$$C_S = C_{Sconst} + C_{Stouch} \quad (10)$$

where $C_{Sconst}$ is the capacitance of a sensor when touch is absent, and $C_{Stouch}$ is the change in capacitance caused by an input, such as a finger touch. The informative part of the sensor capacitance $C_S$ is the $C_{Stouch}$ component. In order to increase the resolution of the sensor, the particular compensation of the current generated by the $C_{Sconst}$ capacitance can be used. There are several possible implementations of this technique. In one embodiment, an ADC 1701 with differential inputs may be used as illustrated in FIG. 17. In the circuit of FIG. 17, the $U_{comp}$ voltage is supplied to the second input of ADC 1701.

Figure 18A:
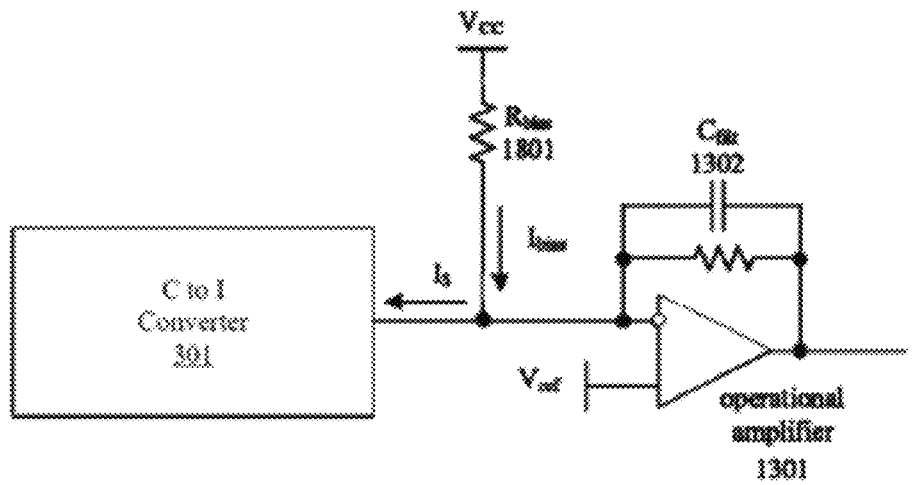
FIG. 18A illustrates base capacitance current compensation using a resistor as a current sink in a capacitance to current converter, according to one embodiment.
Figure 18B:
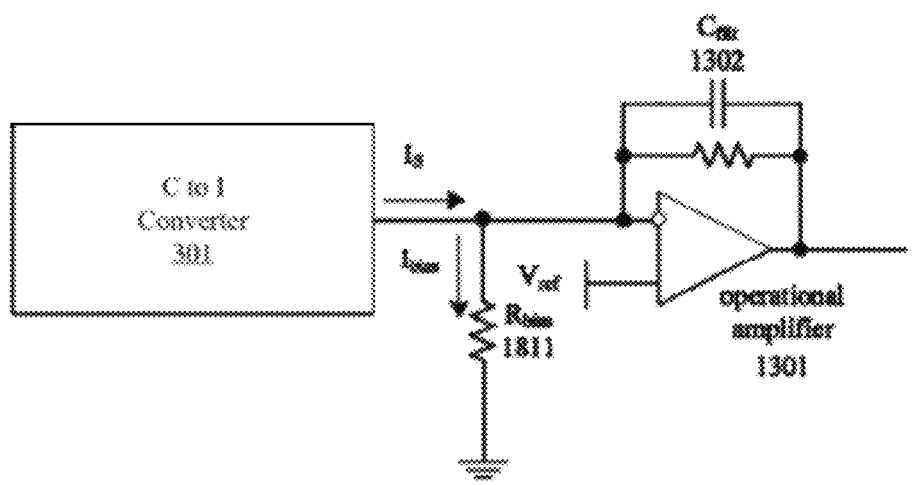
FIG. 18B illustrates base capacitance current compensation using a resistor for a current source in a capacitance to current converter, according to one embodiment.
Figure 19A:
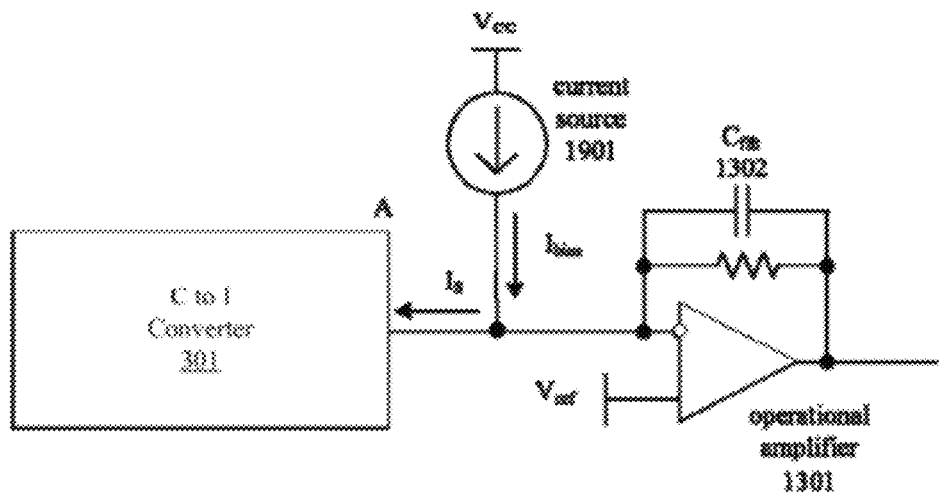
FIG. 19A illustrates base capacitance current compensation using a current source as a current sink in a capacitance to current converter, according to one embodiment.
Figure 19B:
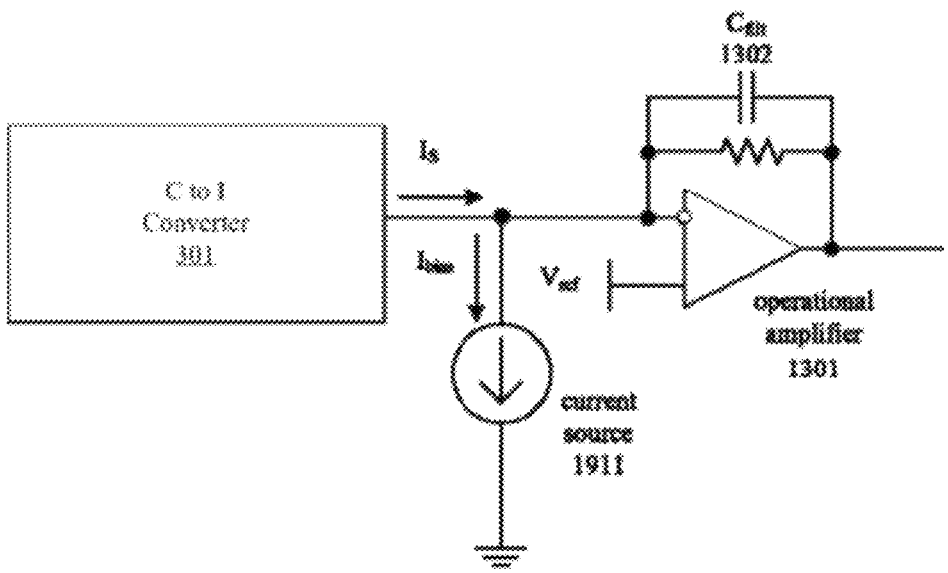
FIG. 19B illustrates base capacitance current compensation using a current source in a capacitance to current converter, according to one embodiment.

Alternative embodiments provide base-capacitance current compensation using a programmable current source or a resistor, as illustrated in FIGS. 18A, 18B, 19A, and 19B. More specifically, FIG. 18A illustrates base-capacitance current compensation using a resistor $R_{bias}$ 1801 as a current source in a capacitance-to-current converter, according to one embodiment. FIG. 18B illustrates base capacitance current compensation using a resistor $R_{bias}$ 1811 as a current sink in a capacitance-to-current converter, according to one embodiment. Current source 1901 and current source 1911 add and subtract current to and from the capacitance-to-current conversion circuits current onto $C_{int}$ 1302, respectively. FIG. 19A illustrates base-capacitance current compensation using a current source 1901 as a current sink in a capacitance-to-current converter, according to one embodiment. FIG. 19B illustrates base-capacitance current compensation using a current source 1911 in a capacitance-to-current converter, according to one embodiment. The $R_{bias}$ 1801 and $R_{bias}$ 1811 add and subtract current to and from the capacitance-to-current conversion circuits current onto $C_{int}$ 1302, respectively.

Figure 20A:
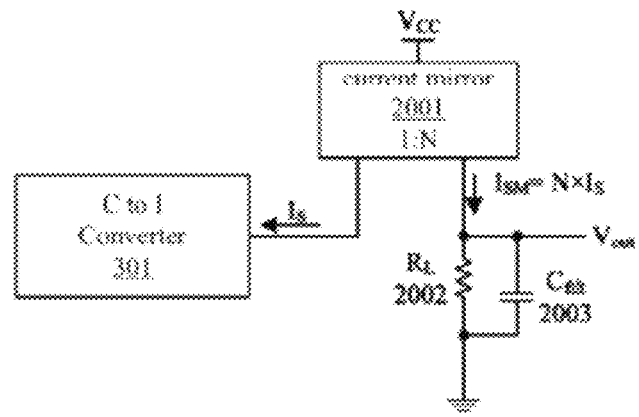
FIG. 20A illustrates using a current mirror with a voltage conversion system, according to one embodiment.
Figure 20B:
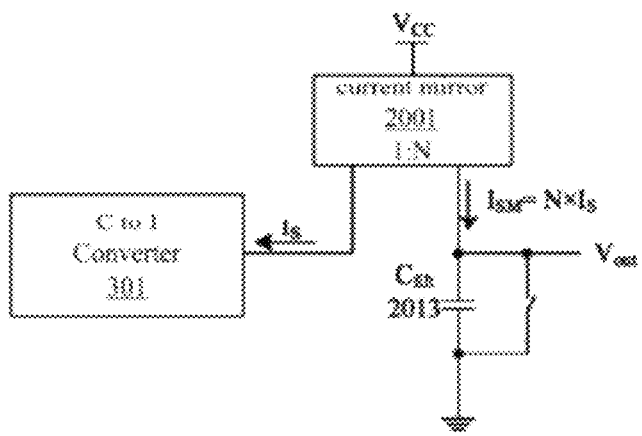
FIG. 20B illustrates using a current mirror with a current conversion system, according to one embodiment.
Figure 20C:
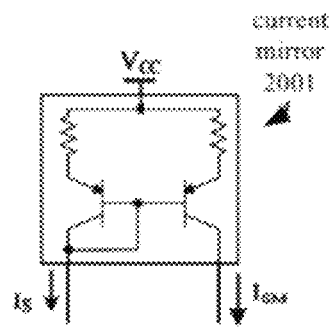
FIG. 20C illustrates one embodiment of a current mirror using a bipolar process technology.

FIGS. 20A, 20B, and 20C illustrate using a current mirror 2001 in the conversion circuits. FIG. 20A shows an example of a circuit for current-to-voltage conversion using a low-pass filter, formed by the combination of load resistance $R_L$ 2002 and filter capacitor $C_{filt}$ 2003. The current to voltage conversion is carrying out on the output of capacitance-to-current converter 301. A filter output voltage can be measured using an ADC, such as that shown FIG. 12 (element 1202). FIG. 20B illustrates a current-to-current conversion circuit. A current ($I_{SM}$) is sourced to the integration capacitor $C_{int}$ 2013 from current mirror 2001 which is coupled to and mirrors the current ($I_S$) of capacitance-to-current converter 301. The different circuits can be used for integration capacitor current measurement. In one embodiment, a current can be measured using a threshold comparator and a timer (not shown). In another embodiment, an integration capacitor voltage is measured using an ADC after running a capacitance-to-current operation within a predefined amount of time. The current mirror has low input impedance, which allows keeping a current mirror input pin voltage close to a constant voltage (e.g., $V_{DD}$). This embodiment may optimize the operating conditions of the capacitance-to-current conversion circuit, allowing the use of a voltage buffer with a smaller slew rate and reduced current consumption. Also, the current mirror serves as a current amplifier or attenuator, boosting or reducing the converter current by a factor of N. Many implementations of the current mirror circuit are possible, and one implementation using bipolar transistors is shown at FIG. 20C (element 2001). Equivalent circuits may be made with MOS, CMOS, and other circuit techniques.

Figure 21:
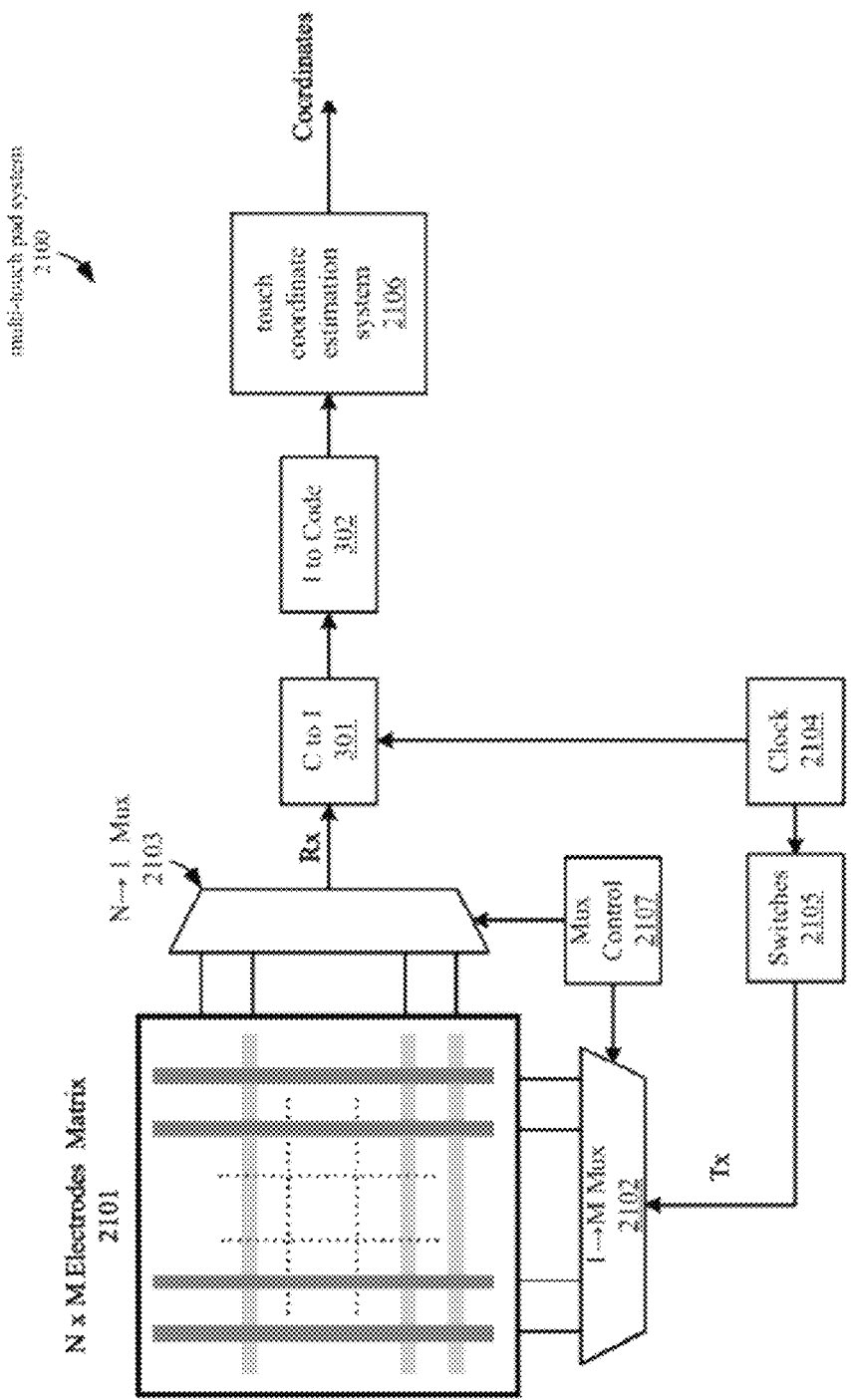
FIG. 21 illustrates one embodiment of a capacitance measurement circuit in a multi-touch touchpad system.

FIG. 21 illustrates a simplified schematic of a multi-touch touchpad system. The multi-touch touchpad system 2100 is composed of a dual dimension array (matrix) of electrodes 2101 coupled to column and row signal multiplexers 2102 and 2103. Multiplexor control 2107, clock source 2104, drive switches 2105 couple electrodes matrix 2101 to capacitance-to-current converter 301. Capacitance-to-current converter 301 is coupled to current-to-code converter 302. Current-to-code converter 302 is coupled to touch coordinate estimation system 2106. The electrodes matrix 2101 can be fabricated from any conductive material, as copper, conductive ink, Indium Tin Oxide (ITO), PEDOT, etc.

Figure 22:
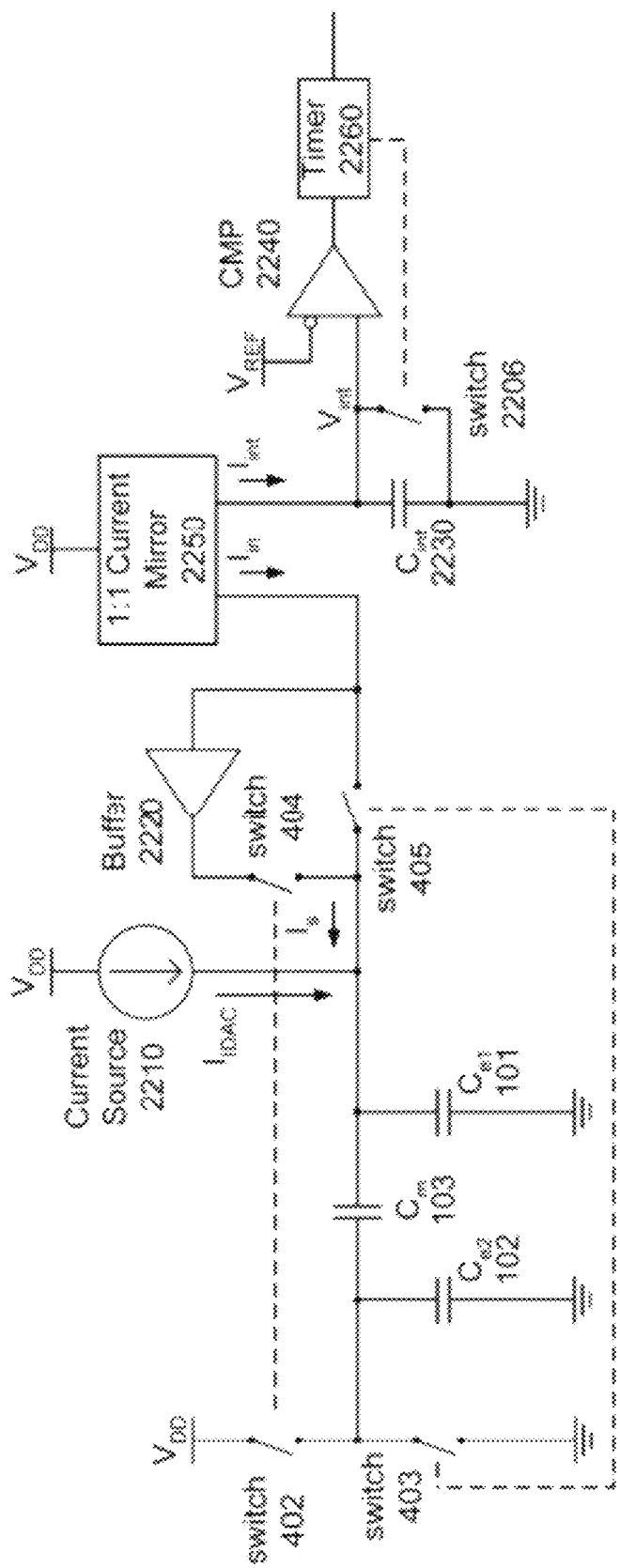
FIG. 22 illustrates one embodiment of a capacitance to current converter with a conversion circuit comprising a current mirror, an integration circuit and a timer.

FIG. 22 illustrates one embodiment of the capacitance-to-current converter comprising a current mirror 2250 and integration circuit ($C_{int}$ 2230, switch 2206 and CMP 2240) and a timer 2260.

Sensitivity and resolution of the capacitance measurement circuit are increased and the scan time is reduced with the addition of the compensating current $I_{IDAC}$ generated by the programmable current supply IDAC 2210. The result summary current is generated and given by:

$$I_{in} = I_s - I_{IDAC} \quad (11)$$

Current mirror 2250 mirrors $I_{in}$ into $I_{int}$ with a transmission efficiency $K_1 = -1$. A reset switch on current integrator capacitor $C_{int}$ along with a timer 2260 and a comparator CMP 2240, digitize the current from current mirror 2250. Before measurement, the voltage on capacitor $C_{int}$ 2230 is reset to a reset potential by reset switch 2206. During operation, charge integration on $C_{int}$ 2230 increases the voltage across $C_{int}$ 2230 as:

$$U_{Cint} = I_{int} \cdot \frac{t_{int}}{C_{int}} \quad (12)$$

The voltage across $C_{int}$, $U_{Cint}$, reaches a threshold $V_{ref}$ on the comparator CMP 2240 input, causing a hold on timer 2260 which is started at the beginning of the charge integration. The output of the timer is a digital representation of the non-compensated capacitance of $C_m + C_F$. (wherein $C_R$ is the change in $C_m$ caused by the presence of a finger or other conductive object). The full equation for the conversion of capacitance to current to counts is given by:

$$T_x = \frac{U_{Vref}}{K_1 (f_{sw} \cdot U_{Vdd} \cdot C_m - I_{IDAC} - f_{sw} \cdot U_{Vdd} \cdot C_F)} \cdot C_{int} \quad (13)$$

This timer output signal may be used to operate reset switch 2206. In an alternate embodiment, integration capacitor reset switch 2206 may be operated by a state-machine or under control of a CPU executing instructions. Before measuring, the timer register's values are configured to initial values. The integration time may be sampled by a timer clock signal with a period of $$T_{ref} = \frac{1}{f_{ref}} \quad (14)$$

The result of the value of the clock frequency cycle number in one integration cycle of the measured current is given by:

$$N_x = \frac{T_x}{T_{ref}} \pm 1 \quad (15)$$

In the foregoing specification, the invention has been described with reference to specific embodiments thereof. It will, however, be evident that various modifications and changes may be made thereto without departing from the broader spirit and scope of embodiments of the invention.

What is claimed is:

1. A capacitive measurement circuit, comprising:
    a first electrode capacitively coupled with a second electrode;
    a first plurality of switches coupled with the first electrode; and
    a second plurality of switches coupled with the second electrode, wherein, during a first operation stage, the first plurality of switches is configured to apply a first initial voltage to the first electrode and the second plurality of switches is configured to apply a second initial voltage to the second electrode, and wherein, during a second operation stage, the first plurality of switches is configured to connect the first electrode with a measurement circuit, and the second plurality of switches is configured to connect the second electrode with a constant voltage,
    wherein the measurement circuit is configured to generate an output signal based on a current generated by operation of the first plurality of switches, the circuit generating the output signal including a current mirror with a first end and a second end, the first end coupled to the first plurality of switches.

2. The measurement circuit of claim 1, wherein the circuit generating the output signal based on the current generated by the operation of the first plurality of switches further comprises:
    a charge integration circuit coupled to the second end of the current mirror;
    a comparator coupled to the charge integration circuit at a first comparator input and a reference voltage on a second comparator input; and
    a timer coupled to an output of the comparator.

3. The measurement circuit of claim 2, wherein an output of the timer is equivalent to the current generated by the operation of the first plurality of switches.

4. The capacitance measurement circuit of claim 1, wherein the second initial voltage is approximately equal to the first initial voltage.

5. The capacitance measurement circuit of claim 1, wherein the first initial voltage is approximately equal to a voltage supplied by the measurement circuit to the first electrode during the second operation stage.

6. The capacitance measurement circuit of claim 5, further comprising a buffer configured to generate the first initial voltage based on the voltage supplied by the measurement circuit.

7. A capacitance measurement method, comprising:
    applying a first initial voltage to a first electrode during a first operation stage, wherein the first electrode is capacitively coupled with a second electrode;
    applying a second initial voltage to the second electrode during the first operation stage;

connecting the first electrode with a measurement circuit during a second operation stage;

connecting the second electrode to a constant voltage during the second operation stage; and generating an output signal based on a net current detected by the measurement circuit during the first operation stage and the second operation stage, wherein the output signal is generated by a current mirror coupled to the current detected by the measurement circuit and coupled to a charge integration circuit coupled to a comparator and a timer.

8. The capacitance measurement method of claim 7, wherein the second initial voltage is approximately equal to the first initial voltage.

9. The capacitance measurement method of claim 7, wherein the first initial voltage is approximately equal to a voltage supplied by the measurement circuit to the first electrode during the second operation stage.

10. The capacitance measurement method of claim 9, further comprising buffering the voltage supplied by the measurement circuit to generate the first initial voltage.

11. A capacitance measurement circuit, comprising:
a first electrode capacitively coupled with a second electrode;
a first plurality of switches coupled with the first electrode; and
a second plurality of switches coupled with the second electrode, wherein the first plurality of switches is configured to connect the first electrode with a measurement circuit during a first operation phase and to connect the first electrode to a constant voltage during a second operation phase, and wherein the second plurality of switches is configured to minimize a voltage difference between the second electrode and the first electrode during the first operation phase and during the second operation phase.

12. The capacitance measurement circuit of claim 11, wherein the measurement circuit is configured to generate an output signal based on a current generated by operation of the first plurality of switches.

13. The measurement circuit of claim 12, wherein the output signal based on the current generated by the operation of the first plurality of switches is generated by a circuit comprising:
a current mirror with a first end and a second end, the first end coupled to the first plurality of switches;
a charge integration circuit coupled to the second end of the current mirror;
a comparator coupled to the charge integration circuit at a first comparator input and a reference voltage on a second comparator input; and
a timer coupled to an output of the comparator.

14. The measurement circuit of claim 13, wherein an output of the timer is equivalent to the current generated by the operation of the first plurality of switches.

15. The capacitance measurement circuit of claim 11, wherein the second plurality of switches is further configured to:
during the first operation phase, connect the second electrode to a voltage approximately equal to a voltage supplied by the measurement circuit to the first electrode; and
during the second operation phase, connect the second electrode to a voltage approximately equal to the constant voltage.

16. The capacitance measurement circuit of claim 15, further comprising a buffer configured to generate the voltage approximately equal to the voltage supplied by the measurement circuit to the first electrode.

17. The capacitance measurement circuit of claim 11, wherein the constant voltage is a ground voltage.

18. A capacitance measurement method, comprising:
connecting a first electrode to a measurement circuit during a first operation phase, wherein the first electrode is capacitively coupled to a second electrode;
connecting the first electrode to a constant voltage during a second operation phase; and
minimizing a voltage difference between the second electrode and the first electrode during the first operation phase and the second operation phase.

19. The capacitance measurement method of claim 18, further comprising generating an output signal based on a net current detected by the measurement circuit during the first operation phase and the second operation phase.

20. The capacitance measurement method of claim 19, wherein the output signal is generated by a current mirror coupled to the current detected by the measurement circuit and coupled to a charge integration circuit coupled to a comparator and a timer.

21. The capacitance measurement method of claim 18, wherein minimizing the voltage different comprises:
during the first operation phase, connecting the second electrode to a voltage approximately equal to a voltage supplied by the measurement circuit to the first electrode; and
during the second operation phase, connecting the second electrode to a voltage approximately equal to the constant voltage.

22. The capacitance measurement method of claim 21, further comprising using a buffer connected to the measurement circuit to generate the voltage approximately equal to the voltage supplied by the measurement circuit to the first electrode.

23. The capacitance measurement method of claim 18, wherein the constant voltage is a ground voltage.

* * * * *